(12) United States Patent
Matsuoka (10) Patent No.: US 8,270,158 B2
(45) Date of Patent: Sep. 18, 2012

(54) HOUSING CONSTRUCTION FOR MOBILE COMPUTING DEVICE

(75) Inventor: Yoshimichi Matsuoka, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1297 days.

(21) Appl. No.: 11/948,741

(22) Filed: Nov. 30, 2007

(65) Prior Publication Data

US 2009/0059495 A1 Mar. 5, 2009

Related U.S. Application Data

(63) Continuation-in-part of application No. 11/848,184, filed on Aug. 30, 2007, now abandoned.

(51) Int. Cl.
*G06F 1/16* (2006.01)
(52) U.S. Cl. ............... 361/679.55; 345/156; 455/575.3; 257/296
(58) Field of Classification Search .......... 345/173, 345/169, 174, 4, 156, 32; 455/550, 564, 455/575.1, 575.3, 573; 178/18.03; 235/492, 235/493, 494; 439/160, 607.53, 83; 361/679.5, 361/679.48, 679.49, 679.55, 679.21, 679.22, 361/679.23, 679.02; 257/432, 98, 296, 324
See application file for complete search history.

(56) References Cited

U.S. PATENT DOCUMENTS

| | | |
|---|---|---|
| 3,744,034 A | 7/1973 | Paul |
| 4,559,705 A | 12/1985 | Hodge et al. |
| D288,746 S | 3/1987 | Allekotte |
| 4,860,372 A | 8/1989 | Kuzumuki et al. |
| D306,176 S | 2/1990 | Yubisui et al. |
| 4,916,441 A | 4/1990 | Gombrich |
| 4,927,986 A | 5/1990 | Daly |
| 4,972,496 A | 11/1990 | Sklarew |
| 5,040,296 A | 8/1991 | Yerger |
| 5,049,862 A | 9/1991 | Dao et al. |
| D326,446 S | 5/1992 | Wong |
| 5,128,829 A | 7/1992 | Loew |
| 5,165,415 A | 11/1992 | Wallace et al. |
| 5,205,017 A | 4/1993 | Wang |
| 5,205,107 A | 4/1993 | Herink |
| 5,231,381 A | 7/1993 | Duwaer |
| 5,253,142 A | 10/1993 | Wang |
| 5,283,862 A | 2/1994 | Lund |
| 5,305,394 A | 4/1994 | Tanaka |

(Continued)

FOREIGN PATENT DOCUMENTS

JP 407248867 A 9/1995

(Continued)

OTHER PUBLICATIONS

International Search Report and Written Opinion of the International Searching Authority in International Application PCT/US2006/038790, European Patent Office, Oct. 24, 2007, 18 pgs.

(Continued)

*Primary Examiner* — Hung Duong (57) ABSTRACT

A primary housing segment is provided for a computing device. The primary housing segment may be unitarily formed and shaped to provide (i) at least a majority of a plurality of perimeter surfaces, the perimeter surfaces including a pair of opposing lateral surfaces, a bottom surface, and a top surface; (ii) one or more frontal surface regions; and (iii) a rear surface to retain an integrated substrate module.

23 Claims, 8 Drawing Sheets

U.S. PATENT DOCUMENTS

| | | |
|---|---|---|
| D346,591 S | 5/1994 | Lee |
| 5,323,291 A | 6/1994 | Boyle |
| D355,165 S | 2/1995 | Sakaguchi et al. |
| D355,166 S | 2/1995 | Sakaguchi et al. |
| 5,389,745 A | 2/1995 | Sakamoto |
| D356,550 S | 3/1995 | Mizusugi et al. |
| 5,398,310 A | 3/1995 | Tchao et al. |
| 5,401,917 A | 3/1995 | Yoshida et al. |
| 5,422,442 A | 6/1995 | Gouda et al. |
| 5,430,248 A | 7/1995 | Levy |
| 5,434,929 A | 7/1995 | Beernink et al. |
| 5,444,192 A | 8/1995 | Shetye et al. |
| 5,448,433 A | 9/1995 | Morehouse et al. |
| 5,452,371 A | 9/1995 | Bozinovic et al. |
| 5,476,336 A | 12/1995 | Osiecki et al. |
| D366,220 S | 1/1996 | Sakamoto |
| D366,463 S | 1/1996 | Ive et al. |
| 5,489,924 A | 2/1996 | Shima et al. |
| D368,079 S | 3/1996 | Ive et al. |
| 5,506,749 A | 4/1996 | Matsuda |
| 5,550,715 A | 4/1996 | Hawkins |
| 5,528,743 A | 6/1996 | Tou et al. |
| 5,528,746 A | 6/1996 | Yumine et al. |
| 5,534,892 A | 7/1996 | Tagawa |
| 5,548,477 A | 8/1996 | Kumar et al. |
| 5,555,157 A | 9/1996 | Moller |
| 5,564,850 A | 10/1996 | Nagaoka |
| 5,576,502 A | 11/1996 | Fukushima et al. |
| 5,615,284 A | 3/1997 | Rhyne et al. |
| 5,621,817 A | 4/1997 | Bozinovic |
| 5,630,148 A | 5/1997 | Norris |
| 5,635,682 A | 6/1997 | Cherdak et al. |
| 5,638,257 A | 6/1997 | Kumar et al. |
| 5,646,649 A | 7/1997 | Iwata et al. |
| 5,657,459 A | 8/1997 | Yanagisawa et al. |
| D385,299 S | 10/1997 | Adams |
| 5,698,822 A | 12/1997 | Haneda et al. |
| 5,737,183 A | 4/1998 | Kobayashi et al. |
| 5,757,681 A | 5/1998 | Suzuki et al. |
| 5,786,061 A | 7/1998 | Banfield |
| D397,679 S | 9/1998 | Hawkins et al. |
| 5,810,461 A | 9/1998 | Ive et al. |
| 5,818,182 A | 10/1998 | Viswanadham et al. |
| 5,821,510 A | 10/1998 | Cohen et al. |
| 5,831,613 A | 11/1998 | Johnston et al. |
| 5,841,901 A | 11/1998 | Arai et al. |
| 5,848,298 A | 12/1998 | Steere, Jr. et al. |
| 5,873,372 A | 2/1999 | Honeycutt et al. |
| 5,889,512 A | 3/1999 | Moller et al. |
| D408,021 S | 4/1999 | Haitani et al. |
| 5,894,425 A | 4/1999 | Saliba |
| 5,898,568 A | 4/1999 | Cheng |
| D410,440 S | 6/1999 | Carnell |
| D411,179 S | 6/1999 | Toyosato |
| D411,181 S | 6/1999 | Tamaki et al. |
| 5,913,629 A | 6/1999 | Hazzard |
| 5,914,708 A | 6/1999 | La Grange et al. |
| 5,941,648 A | 8/1999 | Robinson |
| 5,942,177 A | 8/1999 | Banfield |
| 5,953,205 A | 9/1999 | Kambayashi et al. |
| D416,001 S | 11/1999 | Tal et al. |
| D417,657 S | 12/1999 | Matsumoto |
| 5,996,956 A | 12/1999 | Shawver |
| 5,999,827 A | 12/1999 | Sudo et al. |
| D420,987 S | 2/2000 | Miyahara et al. |
| 6,028,765 A | 2/2000 | Swindler et al. |
| 6,032,866 A | 3/2000 | Knighton et al. |
| 6,034,685 A | 3/2000 | Kuriyama et al. |
| D422,271 S | 4/2000 | Kawashima |
| D423,468 S | 4/2000 | Jenkins |
| 6,052,279 A | 4/2000 | Friend et al. |
| D424,533 S | 5/2000 | Kandalepas |
| D424,535 S | 5/2000 | Peltola |
| D426,236 S | 6/2000 | Kim et al. |
| 6,102,721 A | 8/2000 | Seto et al. |
| 6,115,248 A | 9/2000 | Canova et al. |
| D436,963 S | 1/2001 | Kim et al. |
| 6,178,087 B1 | 1/2001 | Cho et al. |
| 6,195,589 B1 | 2/2001 | Ketcham |
| D440,542 S | 4/2001 | Hawkins et al. |
| 6,219,256 B1 | 4/2001 | Wu |
| 6,239,968 B1 | 5/2001 | Kim et al. |
| D456,289 S | 4/2002 | Laverick |
| 6,392,639 B1 | 5/2002 | Lee et al. |
| D466,504 S | 12/2002 | Masuda et al. |
| D467,918 S | 12/2002 | Fitch et al. |
| D469,061 S | 1/2003 | Porter |
| D488,162 S | 4/2004 | Korpai |
| 6,842,335 B1 | 1/2005 | Hanson et al. |
| D502,703 S | 3/2005 | Tsujimoto et al. |
| D511,342 S | 11/2005 | Chien |
| D530,698 S | 10/2006 | Lee et al. |
| D532,440 S | 11/2006 | Oas |
| 7,205,959 B2 | 4/2007 | Henriksson |
| 7,231,208 B2 | 6/2007 | Robertson et al. |
| D548,732 S | 8/2007 | Cebe et al. |
| 2003/0157957 A1 | 8/2003 | Wendorff |
| 2005/0264988 A1* | 12/2005 | Nicolosi .................. 361/683 |
| 2006/0265643 A1 | 11/2006 | Saft et al. |
| 2007/0074957 A1 | 4/2007 | Lam et al. |
| 2007/0081303 A1* | 4/2007 | Lam et al. .................. 361/679 |
| 2009/0058819 A1* | 3/2009 | Gioscia et al. ............ 345/173 |

FOREIGN PATENT DOCUMENTS

| | | |
|---|---|---|
| JP | 410260768 A | 9/1998 |
| WO | WO03/001775 | 1/2003 |

OTHER PUBLICATIONS

Palm LifeDrive Quicktrain.qxd, Dec. 6, 2005, (3 pgs).

* cited by examiner

HOUSING CONSTRUCTION FOR MOBILE COMPUTING DEVICE

RELATED APPLICATION(S)

This application is a continuation-in-part of U.S. patent application Ser. No. 11/848,184, entitled MOBILE COMPUTING DEVICE CONSTRUCTION USING FRONT PANELED ASSEMBLY AND COMPONENTS THEREOF, filed on Aug. 30, 2007 now abandoned. The aforementioned priority application is hereby incorporated by reference in its entirety.

TECHNICAL FIELD

The disclosed embodiments relate generally to the field of housings for mobile computing devices.

BACKGROUND

Over the last several years, the growth of cell phones and messaging devices has increased the need for keypads and button/key sets that are small and tightly spaced. In particular, small form-factor keyboards, including QWERTY layouts, have become smaller and more tightly spaced. With decreasing overall size, there has been greater focus on efforts to provide functionality and input mechanisms more effectively on the housings.

In addition to a keyboard, mobile computing devices and other electronic devices typically incorporate numerous buttons to perform specific functions. These buttons may be dedicated to launching applications, short cuts, or special tasks such as answering or dropping phone calls. The configuration, orientation and positioning of such buttons is often a matter of concern, particularly when devices are smaller.

At the same time, there has been added focus to how displays are presented, particularly with the increase resolution and power made available under improved technology. Moreover, form factor consideration such as slimness and appearance are important in marketing a device.

Production of mobile computing devices is made more difficult in the fact that conventional devices use many parts or components. The housing for a typical conventional mobile computing device typically includes a top shell, a bottom shell, and a midframe. The components that comprise the contents of the housing, such as printed circuit boards and display assemblies, normally require additional assembly steps. Many devices include additional housing features that are provided on the device separately. The result is that the devices often have numerous interconnected components. In the case of the housing, the numerous components yield devices that are less durable and more difficult to assemble.

DETAILED DESCRIPTION

Embodiments described herein provide for a mobile computing device constructed to include a panel on which a display area and a keypad are made available. In an embodiment, the display area may be provided flush on the panel. Still further, an embodiment provides that the keypad assembly is molded or integrally formed onto the panel at another region. One result provided by an embodiment is relatively smooth and unifying front face for a mobile computing device, having a substantially flush display area and an integrally formed keypad.

Among other advantages, embodiments recognize that components such as keypads (or keyboards) and display components are increasingly manufactured by different sources and then assembled into one device. Tolerances resulting from the use and combination of different devices may conflict with the acceptable tolerance needed to assemble the device. Moreover, quality control issues arise to design and appearance of prominent exterior features, such as those provided with keypads, displays and the front facade.

Accordingly, one or more embodiments provide for a front assembly that includes a panel that extends to encompass at least a substantial portion of the front face. In one embodiment, the panel overlays the display, while providing a surface on which a keypad or keyboard may be formed. The result is that a large portion of the front face may be made flush are bevel-less, without affect from possible conflicting tolerances that would otherwise result if no such panel existed. The panel that overlays the display component masks any deficiencies in the construction and/or assembly of the display component. By extending the panel to underlie the key structures, one or more embodiments further enable a single source of manufacturing to control the implementation and appearance of both the keypad and display on a front face of the computing device.

In an embodiment, a computing device includes a processor, a display component, a keypad assembly and a panel. The display component includes a display area that is pressure-sensitive to detect user-contact with the device over the display area. The display component is coupled to signal the processor when contact is detected. The keypad assembly includes a plurality of key structures. Each of the key structures is aligned over a corresponding contact element provided on an electrical contact layer. Each key structure is pressable, and the corresponding contact element of each key structure is triggerable with contact to signal the processor. The panel is provided over the display area to extend between the key structures and the electrical contact layer. The panel is structured so that, when the computing device is operational, (i) a user contact with a region of the panel that overlies the display area is detectable by the display component to signal the processor, and (ii) pressure on any key structure is sufficient to move at least a portion of the panel inward into the corresponding contact element in order to trigger the contact element into signaling the processor.

According to another embodiment, a computing device includes a processor, a display component, a keypad assembly and a panel. The display component provides or includes a display area. The keypad assembly includes a plurality of key structures. Each of the key structures may be aligned over a corresponding contact element provided on an electrical contact layer. Each key structure is pressable, and the corresponding contact element of each key structure is triggerable with contact to signal the processor. The panel may be provided over the display area to extend between the key structures and the electrical contact layer. The panel may include at least a translucent window that overlays the display area and is structured so that inward movement of any key structure is sufficient to move at least a portion of the panel inward into the corresponding contact element.

Still further, one or more embodiments provide for a frontal assembly for a mobile computing device. The frontal assembly includes a display component, a keypad assembly, and a panel. The display component includes or provides a display area. The keypad assembly includes a plurality of key structures, and each of the key structures is aligned over a corresponding contact element provided on an underlying electrical contact layer. Each key structure is pressable. The panel may provided over the display area to extend between the key structures and the electrical contact layer. The panel is structured to be in contact with the display area and with the plurality of key structures, so that movement of any key structure is sufficient to move at least a portion of the panel inward into the corresponding contact element.

As used herein, the term "modular" means a pre-assembled or pre-manufactured component. A modular component, for example, means a component that is manufactured and used as one piece in a larger assembly.

Furthermore, the term "substantially flush" means flushness between two surfaces to a degree that appears flush to casual viewing by an observer. For example, two surfaces that are flush within tolerance levels of manufacturing may be said to be "substantially flush".

An embodiment includes a primary housing segment for a computing device. The primary housing segment may be unitarily formed and shaped to provide (i) at least a majority of a plurality of perimeter surfaces, the perimeter surfaces including a pair of opposing lateral surfaces, a bottom surface, and a top surface; (ii) one or more frontal surface regions; and (iii) a rear surface to retain an integrated substrate module.

Still further, an embodiment provides for a hardware module that includes a substrate, and a plurality of electrical components assembled onto the substrate. The plurality of electrical components may include substantially all of the electrical components that are to be used by the computing device. The module may be integrated to form a single piece, so that a computing device that is to include the module is assembled in part by inserting the integrated substrate module as a single piece into a space within the confines of the primary housing segment.

Still further, an embodiment provides for a computing device that includes a housing comprising a primary housing segment, and interior components provided with use of an integrated substrate module.

Figure 1:
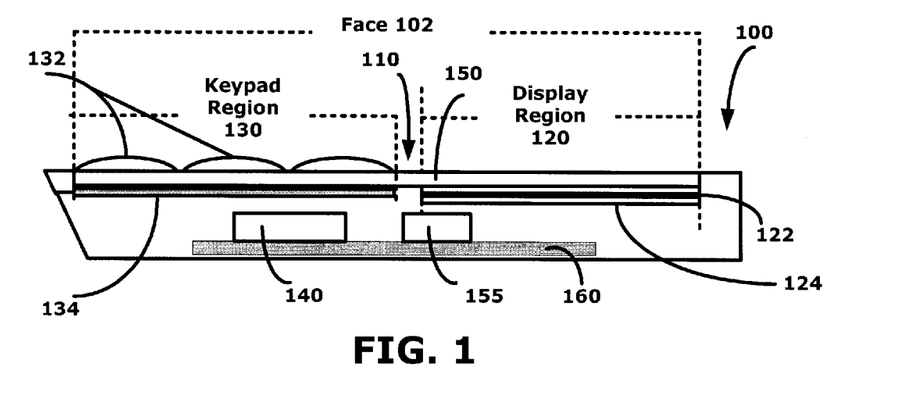
FIG. 1 is a representative side view of a mobile computing device constructed in accordance with an embodiment of the invention.

FIG. 1 is a representative side view of a mobile computing device constructed in accordance with an embodiment of the invention. In an embodiment, a mobile computing device 100 includes a frontal assembly 110 that provides a front face 102 for the device 100. In an embodiment, the front face 102 includes a display area 120 and a keypad region 130. The display area 120 may correspond to a surface provided by a display component such as described with an embodiment of FIG. 2A and FIG. 2B. The keypad region 130 may correspond to a section of the front face 102 on which a keypad, such as a keyboard and/or number pad, is provided. Examples of different types of keypads that may be used to provide the keypad region 130 are described with embodiments of FIG. 3A, FIG. 3B and FIG. 5. As will be described in more detail, one or more embodiments provide that the frontal assembly 110 includes a panel 150 that extends over the display region 120 and under the keypad area 130.

Other features and regions may also be provided on the front face 102. For example, a button set (not shown in FIG. 1) to control use and launch of software and software features, as well as enable navigation, may be provided between the display area 120 and the keypad region 130.

The mobile computing device 100 may include various internal components, including processor 140 and memory 155 provided on a printed circuit board 160. The processor 140 may generate data that is displayed as content on the display area 120, and detect and interpret input made through user-interaction with both the keypad region 130 and the display area 120. Components such as analog-digital converters may be used to process signals from display region and/or keypad assembly 130. For simplicity, such additional components are not shown.

The display region 120 may be provided by a display component. In one embodiment, the display component is provided by a combination of a Liquid Crystal Display (LCD) 122 and contact-sensors 124. The contact-sensors 124 may correspond to, for example, resistive sensors that detect pressure from contact. The processor 140 may detect and interpret contact made with the LCD 122 through signals generated from the contact-sensors. As mentioned, additional signal handling components, such as analog-digital converters, may also be used. The panel 150 may be placed to provide an added exterior thickness to the display region 120.

In an embodiment, the keypad region 130 is provided by a keypad assembly that has anyone of many forms. According to one embodiment, the keypad assembly is made operational with multiple layers, and the layers are separated by the panel 150. An exterior layer may provide the keypad region 130, comprising a thickness that defines plurality of key structures 132. The layer of the key structures 132 may operate in connection with an electrical contact layer 134 that underlies the panel 150 and the plurality of key structures 132. The electrical contact layer 134 may include contacts 335 (FIG. 3B) that are actuatable with contact or sufficient force. The panel 150 may be attached to an underlying surface of the keypad structures 132 and to a top surface of the electrical contact layer 134.

The panel 150 may have the form of a hard coat surface. As such, panel 150 provides a protective exterior for the display component. In one embodiment, the panel 150 is formed from polyethylene terephthalate (PET) film. More generally, the panel 150 may be formed from a material such as plastic. While the panel 150 may provide a protective hard coat, panel 150 may also be sufficiently thin so that inward pressure from one of the key structures 132 translates pressure through the panel 150 and onto the underlying electrical contact element 335 (FIG. 3) for that structure. In one implementation, each key structure 132 is aligned to include its own electrical contact element 335, although other implementations provide that one electrical contact may be shared with different key structures.

Among other benefits, an embodiment such as described with FIG. 1 enables device 100 to have a display region 120 that is bevel-less. More particularly, the display region 120 may be substantially flush with adjacent regions of the front face 102 that are not part of the display region 120. Such a substantially flush transition protects the display component from, for example debris, while at the same time providing a more pleasing design. Additionally, the key structures 132 (or the layer thereof) may be formed directly on the panel 150, simplifying construction and/or assembly of the device 100 as a whole. The panel 150 may also be provided with various design elements that include graphics for individual key structures.

While FIG. 1 is illustrative, the thicknesses shown of various components are not to scale or proportion. In one implementation, the approximate thickness of panel 150 is in the range of 0.1 to 0.3 mm, and more particularly at about 0.2 mm.

Figure 2A:
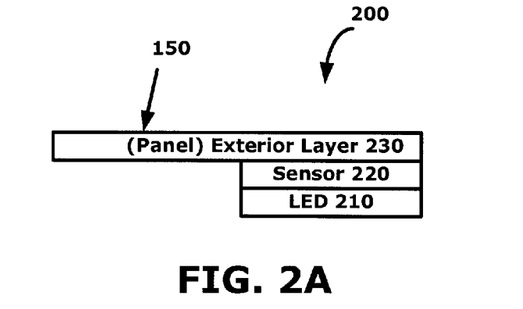
FIG. 2A is a side view of a display component for providing display area 120, under an embodiment of the invention.

FIG. 2A is a side view of a display component for providing display area 120, under an embodiment of the invention. A display component 200 may include multiple thicknesses, generally including an LCD layer 210 and a sensor layer 220. In some alternative implementations, the sensor layer 220 and LCD layer 210 may occupy the same thickness. More layers may be provided, including an exterior protective coat 230. In one embodiment, the exterior protective coat 230 is provided by a portion of panel 150 that extends to support portions of the keyboard assembly 130 (not shown).

As an alternative or addition to an embodiment of FIG. 2A, the exterior protective coat 230 may be formed from a combination of a thin thickness and a rigid backing material. In one implementation, the thin thickness may be provided by a material such as a PET film. An example of an approximate dimension of the PET film is 0.2 mm. The rigid backing material may correspond to, for example, a polycarbonate material having an approximate thickness of about 1.0 mm. In one implementation, the polycarbonate material and the PET film combine at a region that overlays the display. The PET film extends to form the remainder of the panel 150 on which, for example, key structures or a keypad are formed.

The display component 200 may interconnect with the processor 140 and other internal sources of the device 100 (such as power). In order to display content, display component 200 may be coupled to a display driver (not shown) and other components that process the display instructions.

Figure 2B:
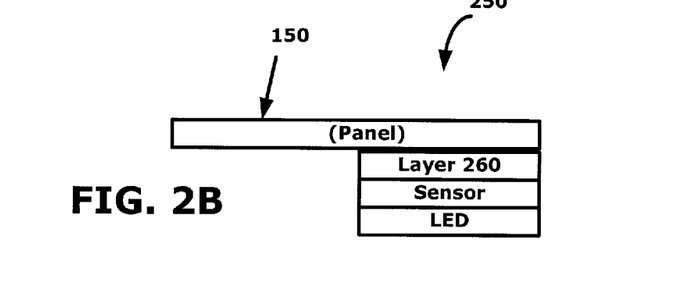
FIG. 2B is a side view of an alternative display component for providing the display area 120, under another embodiment of the invention.

FIG. 2B is a side view of an alternative display component for providing the display area 120, under another embodiment of the invention. In an embodiment of FIG. 2B, the display component is modular, such as an over-the-shelf component. The display component 250 includes multiple thicknesses, including an external hard coat display thickness 260. According to an embodiment, the panel 150 is mounted over the external display thickness 260, so as to provide a second hard-coat layer.

While embodiments illustrated with FIG. 1 and FIG. 2A and FIG. 2B provide for a contact-sensitive display, one or more embodiments described herein provide for a construction in which the mobile computing device 100 includes a non-contact-sensitive display. Under such an embodiment, the display component 200 does not, incorporate the use of the sensor.

Figure 3A:
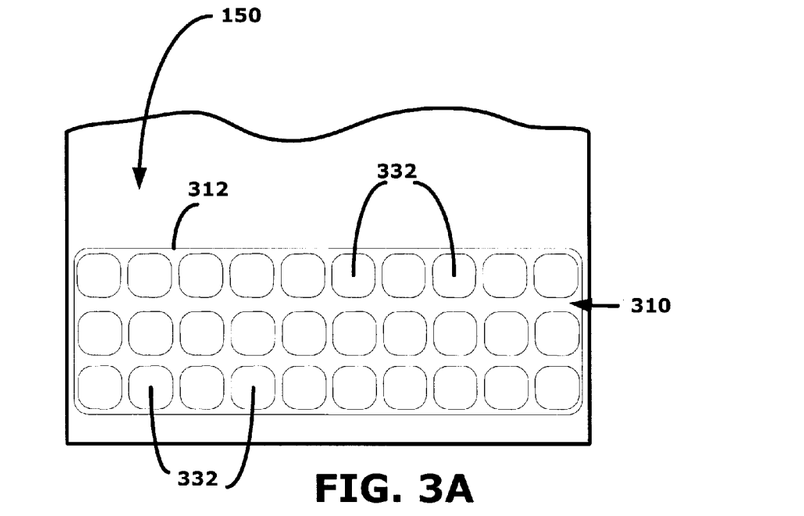
FIG. 3A illustrates a key structure layer for use in a keypad region, such as provided with the front face 102 of device 100 in FIG. 1.

FIG. 3A illustrates a key structure layer for use in a keypad region, such as provided with the front face 102 of device 100 in FIG. 1. Under an embodiment such as shown with FIG. 3A, a plurality of key structures 132 (FIG. 1) are provided by a portion of key structure layer 310 that includes formed or shaped key caps 332. With further reference to an embodiment of FIG. 1, the single piece structure 310 overlays a portion of the panel 150 defined by the keypad region 130. The plurality of key structures 132 may be joined by a carrier 312 that extends between formations corresponding to individual key structures. The carrier 312 may correspond to a base or web layer that interconnects some or all of the key structures. The key structure layer 310 may be formed from resin, plastic or other material. In one embodiment, the key structure layer is translucent, so as to make visible any markings or decorative elements provided on the underlying panel 150.

According to an embodiment, the key structures 132 are pressable in that they deform or squish when pushed. As an alternative or addition, however, the key structures 132 may move or travel inward when pressed.

Figure 3B:
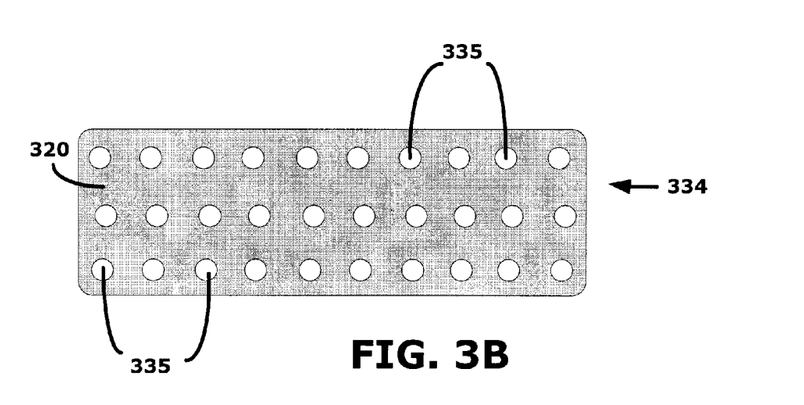
FIG. 3B illustrates the electrical contact layer 334 that underlies the panel 150, according to an embodiment such as shown by FIG. 1.

FIG. 3B illustrates the electrical contact layer 334 that underlies the panel 150, according to an embodiment such as shown by FIG. 1. An electrical contact layer 334 such as shown in FIG. 3B may be used in connection with the key structure layer 310 to provide a keypad of the keypad region 130 (FIG. 1). In one embodiment, the electrical contact layer 334 corresponds to a printed circuit board 320 having electrical contact elements 335. The electrical contact elements 335 may be in the form of electrical leads, snap dome switches or, for example, other elements that form "switches" having open and closed states. In one implementation, one electrical contact element 335 is aligned under each key structure caps (FIG. 3A) of the key structure layer 310 (FIG. 3A).

As mentioned with FIG. 1, one or more embodiments provide that the panel 150 may extend between the key structure layer 310 of FIG. 3A and the electrical contact layer 334 of FIG. 3B. The panel 150 may be sufficiently thin to enable pressure applied to one of the key structures to translate into sufficient pressure or force to close the aligned electrical contact 335 (FIG. 3B). In an embodiment in which the key structures caps (FIG. 3A) deform, the deformation of any one key structure may provide the pressure onto the panel 150 that triggers the aligned contact element 335 (FIG. 3B) on the underlying PCB 320. In an embodiment in which the key caps 332 move inward, the inward movement of any one key structure may provide the pressure onto the panel 150 that triggers the corresponding aligned contact element 335.

In an embodiment, the plurality of key structures 132 (FIG. 1) is formed onto the panel 150 during a manufacturing process that results in the formation of key caps 332 and carrier 312. For example, injection molding design (IMD) or other molding techniques may be used to form key caps (as the key structures) directly on the panel 150, or alternatively onto a carrier that is formed on the panel 150. As an alternative, the plurality of key structures 132 may be provided by assembling or affixing the structure 310 (or the key caps 332) onto the panel 150. For example, adhesives may be used to affix the carrier 312 and/or individual key caps 332 onto the panel 150. In either case, one or more embodiments provide that panel 150 may be imprinted to carry some or all of the graphics provided with the key structures 132 (FIG. 1). For example, as described with one or more other embodiments, individual key structures may be provided with graphics that indicate an alphanumeric value or icon.

Figure 4:
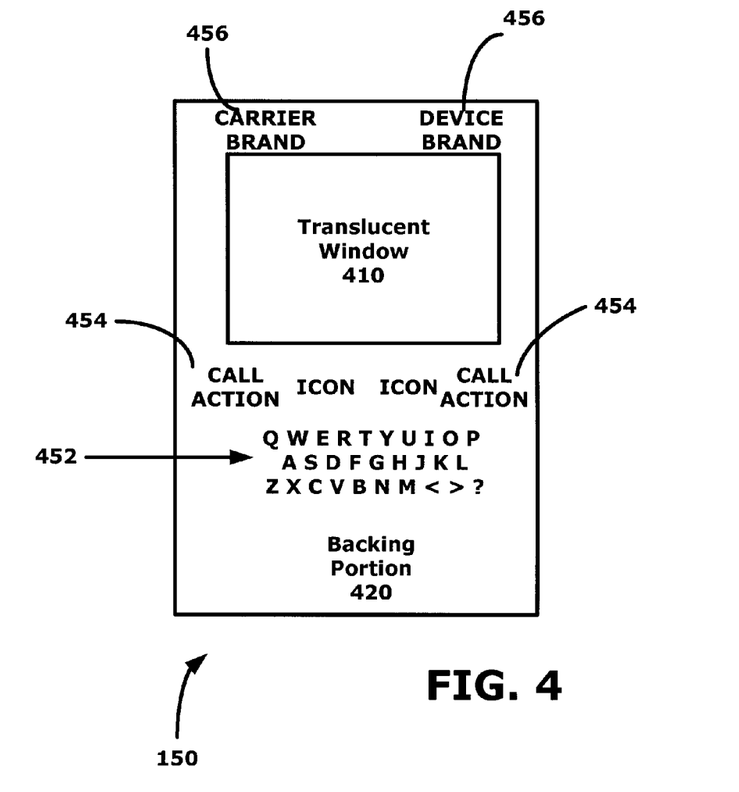
FIG. 4 illustrates the panel 150 used for frontal assembly 110, according to an embodiment of the invention.

FIG. 4 illustrates the panel 150 used for frontal assembly 110, according to an embodiment of the invention. The panel 150 may be dimensioned to be substantially rectangular so as to extend at least a majority of the length of the front face. In an embodiment, the panel 150 includes a clear (or translucent) window 410 and a backing portion 420. The window 410 may be dimensioned to substantially match an area used by thee display component 120, so that it can overlay the display component (such as shown with an embodiment of FIG. 2A or FIG. 2B) without occluding any part of the display region 120.

The backing portion 420 provides the surface on which the plurality of key structures 132 (FIG. 1) are formed or are otherwise provided. In an embodiment, the backing portion 420 of panel 150 may have imprints or graphics that form some or all of the key structure graphics. For example, a first set of graphics 452 may correspond to prints of letters and numbers in regions that are to underlay key structures 132 when the key structures are subsequently attached or formed on the panel. The graphics 452 may be positioned in regions that underlie corresponding key structures 132 that are to carry that value when the device is in use. In one implementation, some key structures carry letter values, number values or both. Furthermore, under one implementation, the graphics 452 may represent key structure values in a specific mode of operation of the device (e.g. default mode), as logic and/or software on the device may assign other values to individual key structures.

As an alternative or addition to graphics for a keypad, other graphics 454 may also be provided for a button (or key) set area of the device. For example, many types of mobile computing devices include a button set adjacent to the display area that includes navigation functionality, call action buttons (e.g. answer incoming call, hang-up), feature buttons for device or software control, and/or application launch buttons. Functionality associated with some or all of these buttons may be represented iconically, or otherwise through graphics. The set of graphics 454 may be imprinted onto panel 150 to provide such iconinc graphics for buttons of such a button set.

Other examples of graphics or imprints that may be provided on the panel 150 including branding graphics 456. In an embodiment in which the mobile computing device 100 uses cellular networks, the device may carry both a wireless carrier brand and a manufacturing or device brand. Other brands may also be carried, such as a brand for the operating system in use on the device.

Figure 5:
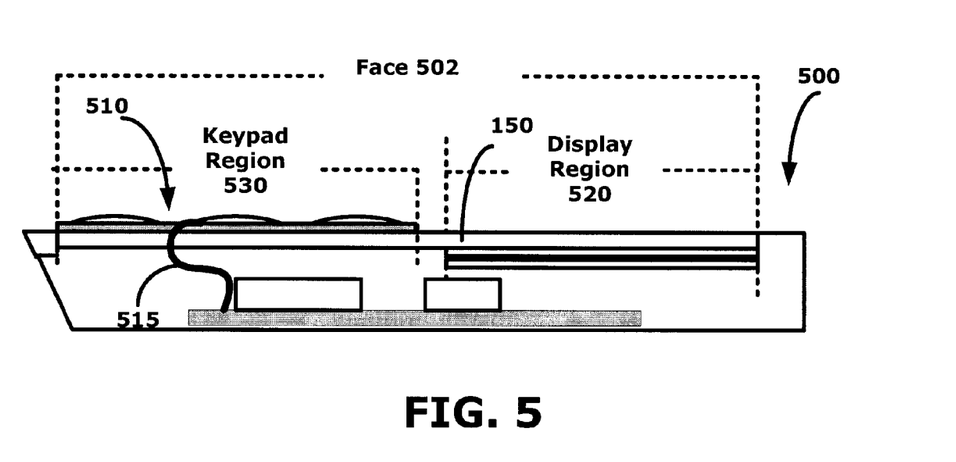
FIG. 5 is a representative side view of a mobile computing device having an alternative construction in which a modular keypad component is used, according to an embodiment of the invention.

FIG. 5 is a representative side view of a mobile computing device having an alternative construction in which a modular keypad component is used, according to an embodiment of the invention. On a device 500, a modular keypad component 510 may combine a layer of key structures and the electrical contact layer into one thickness that can be mounted onto the backing portion 420 (FIG. 4) of the panel 150.

One example of such a modular keypad is a "sheet key", which is a pre-manufactured component. The modular keypad component 510 may provide a keyboard (e.g. having a QWERTY arrangement) with, for example, alternative numerical assignments to select keys in order to enable corresponding numeric input (e.g. such as to place phone calls). A flex cable 515 may interconnect the keypad component 510 to internal components of the device, including processing resources 140 and power (not shown).

Housing Construction Design

One or more embodiments include a housing construction for a mobile computing device that includes a unitary primary housing element that provides a midframe, as well as at least some of a frontal housing and read housing. Embodiments described with FIG. 6A thru FIG. 8 may be used with any of the embodiments described above. Alternatively, however, the housing construction shown and described with FIG. 6A thru FIG. 8 may be employed independently or without use of features included or provided as part of embodiments described above.

According to an embodiment, a primary housing segment is provided for a mobile computing device. The primary housing segment may be unitarily shaped to provide at least a majority of a pair of opposing lateral surfaces, a bottom surface, and/or a top surface. The primary housing segment may also be shaped to include one or more frontal structural surfaces that are positioned to retain an integrated substrate module or component of the computing device when the computing device is assembled. Additionally, the primary housing segment may be shaped to provide a rear structural surface to retain the integrated substrate module.

Figure 6A:
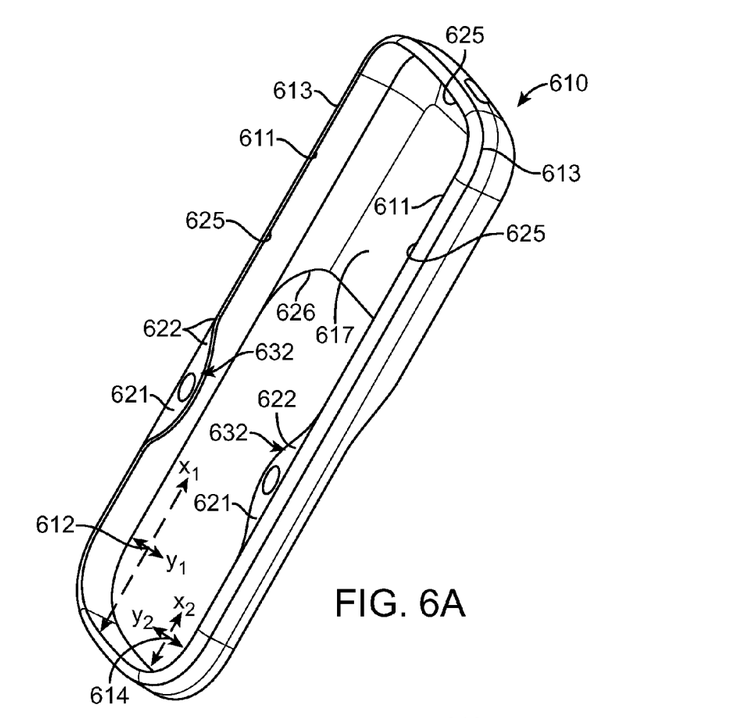
FIG. 6A thru FIG. 6G depict a primary housing segment, under an embodiment of the invention.

FIG. 6A is a front isometric view of a primary housing segment for use with a computing device, according to an embodiment of the invention. In an embodiment, a primary housing segment 610 is unitarily shaped to provide perimeter surfaces and surface regions for a front face 612 (defined by plane $X_1, Y_1$) and a back face 614 (defined by plane $X_2, Y_2$). The planes that define the front face 612 and back face 614 may only be representative tangential planes, as the actual faces may be contoured or otherwise shaped/

The front face 612 may include one or more frontal surface regions 622 and an opening 625 or void. The opening 625 may comprise a substantial portion of the front face 612, so as to comprise a substantially open front face. For example, the opening 625 may comprise at least 60% of the front face, and in one implementation, the opening 625 may comprise 80% or more of the front face. The front face 612 may include an interior or inner perimeter edge 611 that defines the opening 625 of the front face. A surface thickness between the interior perimeter edge 611 and an exterior perimeter edge 613 of the primary housing segment 610 may optionally provide some of the one or more frontal surface regions 622. Such exterior surface thickness may be thin, such as in the form of a perimeter trim or bevel.

Figure 7:
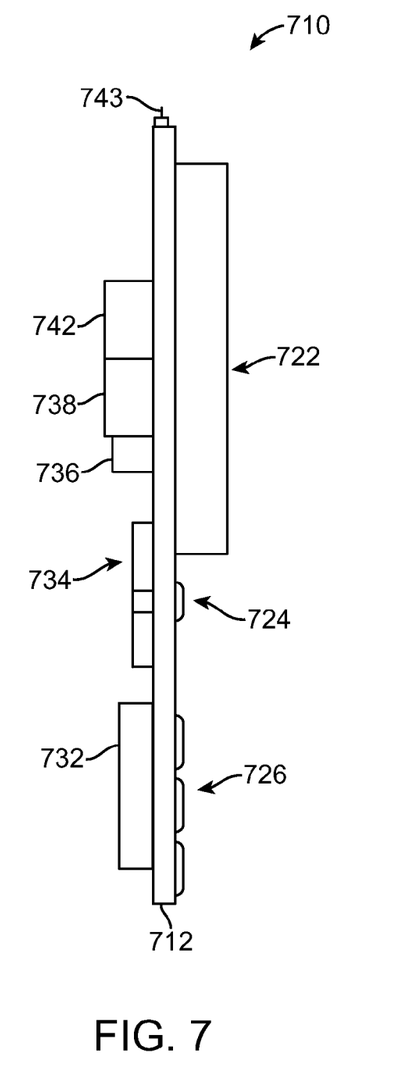
FIG. 7 illustrates an integrated substrate module for use in assembling a computing device, according to an embodiment of the invention.

The frontal surface regions 622 include additional surface formations that can extend over some or all of the face 612. In an embodiment, such formations may correspond to a pair of polygonally-shaped (e.g. circular, oval, square or rectangular) sections 632 that extend inward from the interior perimeter edge 611. Such frontal surface regions may provide structure or support to retain, for example, panel 150 (FIG. 1) and/or an integrated substrate module 710 such as shown and described with an embodiment of FIG. 7A. In an embodiment, an outward surface 621 of the sections 632 also provide button or contact surfaces for enabling the user to manipulate the device.

FIG. 6A also depicts an interior side 617 of a rear surface 624 that forms a portion of back face 614. The back face 614 may also include in opening 626. In an embodiment, the opening 626 of the back face 614 may correspond to a partially open face, in that the opening of the back face is smaller than the opening 622 of the front face, occupying only a fraction or less than a majority of the back face. The opening 622 may be dimensioned to receive a substrate, such as an integrated substrate module 710, described with FIG. 7. In an embodiment, the opening 626 is used in an assembly process to insert the integrated substrate module 710 (see FIG. 7A) as part of an assembly process for the computing device.

Figure 6B:
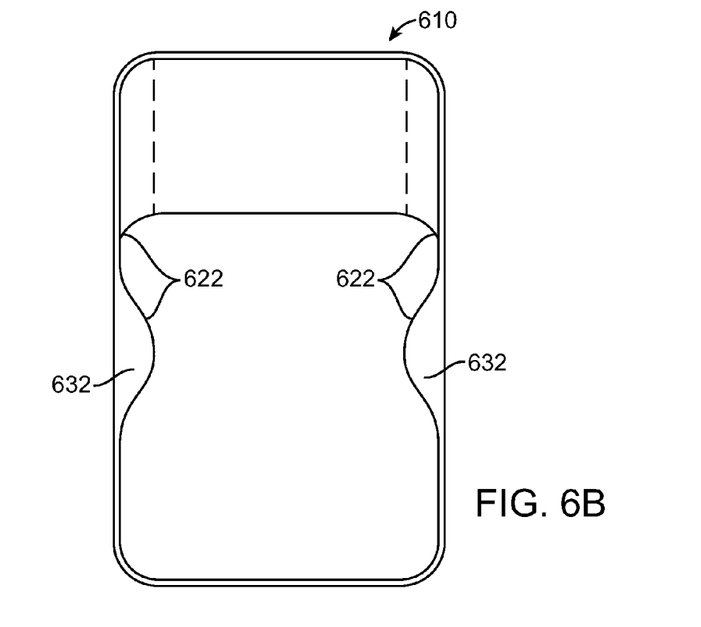

FIG. 6B is a frontal view of the housing segment 610, under an embodiment. The primary housing segment 610 may include frontal surface regions 622 which extend to the polygonally-shaped sections 632 (which are shown to be rounded, inward extensions). The interior surface 617 of the back face 614 (FIG. 6A) is also viewable through the opening 625 (FIG. 6A).

The primary housing segment 610 may be uniformly formed to provide the peripheral surfaces of the housing of the computing device. For example, the primary housing segment 610 may be shaped as part of a molding process to include peripheral surfaces at a top, bottom, and lateral sides, in addition to structure or surface that form at least a portion of the front face 612 and the back face 614.

Figure 6C:
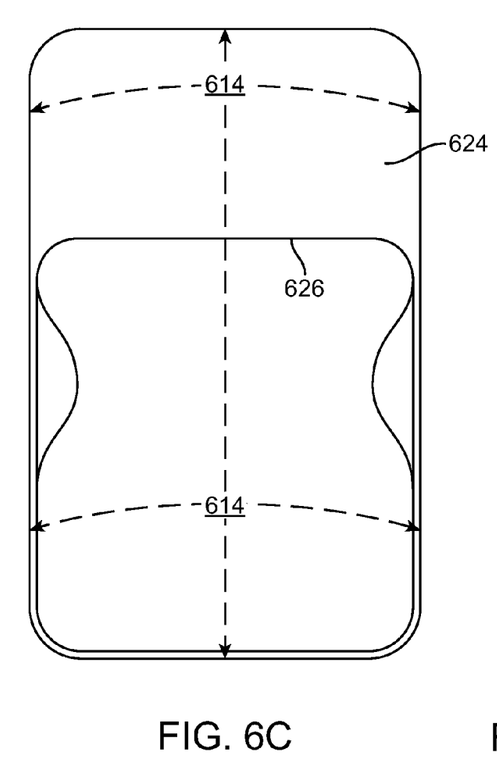
Figure 8:
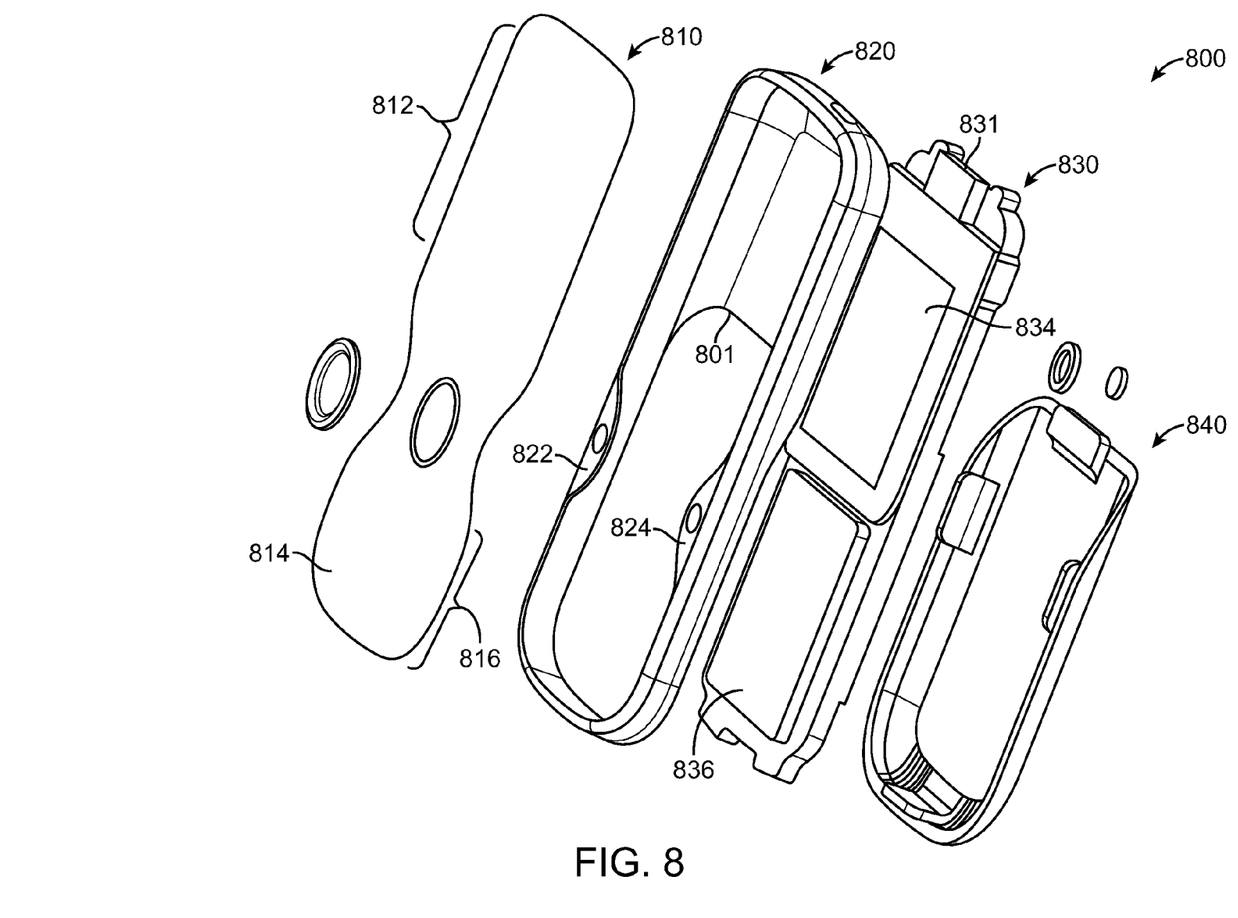
FIG. 8 is an exploded isometric view of a mobile computing device incorporating features of one or more embodiments described herein.

FIG. 6C is a rear view of the primary housing segment 610, under an embodiment. An exterior side 619 of the rear face 624 may form a portion of the shell that the user touches and grasps. The view presented also shows an interior side 633 to the polygonal extensions 632 that form portions of the frontal surface regions 622. The interior side 633 may abut, for example, the integrated substrate module 710 (FIG. 7A) when the device is assembled. The surrounding of the opening 626 may be structured to receive and mate with a corresponding rear panel structure 660 (see FIG. 6H). The rear panel structure 660 may be a battery cover, or cover other components such as a SIM card. Any one of many conventional panel coupling techniques may be used. For example, the rear panel structure 660 may include protrusions that are received and mated with corresponding apertures of the back face 614, while other mating surfaces on the back face 614 may receive the real panel structure 660. FIG. 8 illustrates how a suitable rear panel may be dimensioned and structured to mate with the primary housing segment 610 with an intermediate substrate device.

Figures 6D, 6E:
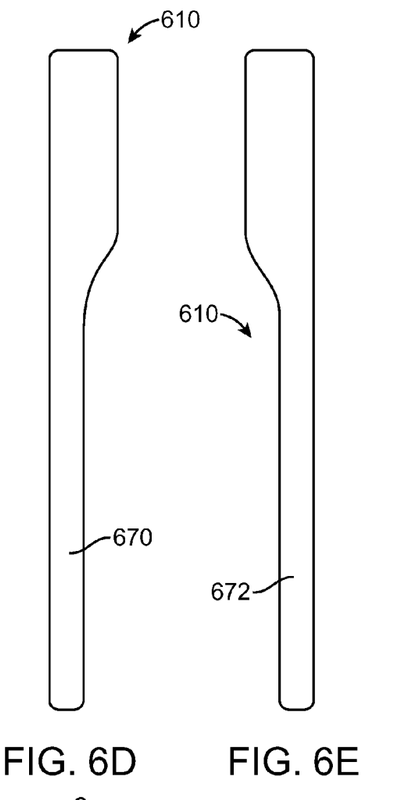

FIG. 6D and FIG. 6E are illustrative side-views of the primary housing segment 610, under an embodiment. The primary housing segment 610 may be shaped (e.g. such as through a molding process) to unitarily provide lateral perimeter surfaces 670, 672. The lateral perimeter surfaces 670, 672 may be used to define lateral edges of the device. The primary housing segment 610 may form all, or at least a substantial majority of the lateral perimeter surfaces 670, 672. For example, some openings or formations may be provided on one or both lateral perimeter surfaces 670, 672 antennas, transmitters, buttons, switches or decor.

Figure 6F:
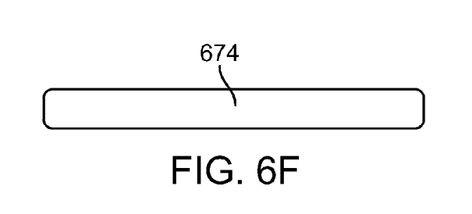
Figure 6G:
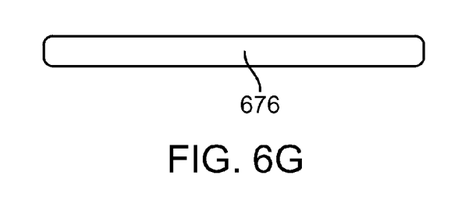
Figure 6H:
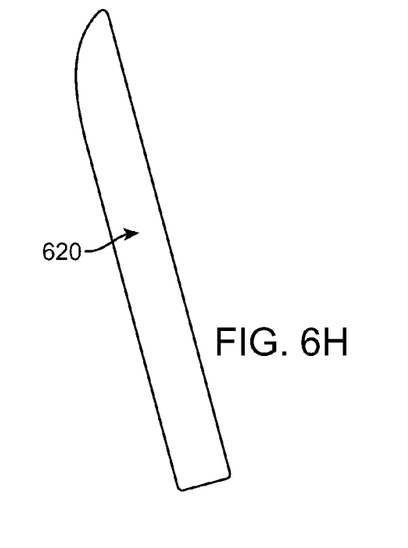
FIG. 6H depicts a rear panel for use with a primary housing segment such as described in FIG. 6A thru FIG. 6G, under an embodiment.

FIG. 6F illustrates a top perimeter surface 674 of the primary housing segment. Likewise, FIG. 6G illustrates a bottom peripheral surface 676. Each of the top and bottom perimeter surfaces 674, 676 may be part of the shape of the unitary primary housing segment. As with lateral perimeter surfaces 670, 672, the top and bottom perimeter surfaces 674, 676 may include openings, cut-outs or other formations to accommodate features such as antennas, transmitters, buttons, switches or decor.

Integrated Substrate Module

FIG. 7 illustrates an integrated substrate module for use as part of a computing device, according to or more embodiments. The integrated substrate module 710 is a pre-assembled, integrated component that contains substantially all of the electrical components and interconnects of a mobile computing device. The integrated substrate module 710 may be assembled into a housing or housing segment as one piece. According to one embodiment, an integrated substrate module is operational in and of itself. Among other benefits, the use of such the integrated substrate module simplifies the assembly process for a mobile computing device. Additionally, a mobile computing device may be tested without being assembled into a housing, thereby providing considerable time and labor savings during testing procedures that are normally required for manufacturing of such devices.

One or more embodiments provide that a primary housing segment such as described with FIG. 6A thru FIG. 6G may be used in connection with integrated substrate module 710 in order to simplify and reduce the steps required to assemble and manufacture a mobile computing device. With reference to FIG. 7, the integrated substrate module 710 includes a substrate 712, such as a printed circuit board, that includes electrical interconnect (e.g. wiring, pins, traces) and a set of pre-mounted or pre-assembled electrical components. In one embodiment, the set of pre-mounted or pre-assembled electrical components include substantially all of the devices electrical components, including the processors and memory components of the device, as a display component. The set of pre-mounted or pre-assembled electrical components may also include other components, such as wireless transmitters and receivers and modems.

In an embodiment, electrical components provided on the integrated substrate module 710 include a display component 722 and separate sets of contact elements 724, 726 or switches for operating a multi-way or multi-state input features (e.g. such as navigation button to button set), application buttons and/or a keypad. The display component 722 may correspond to, for example, an LCD or a touch-sensitive LCD. The integrated substrate module 710 may also include a battery 732, a chip set 734 containing the processor and memory for the device, speakers 736, microphone 738, camera 742 and switch 743. In one embodiment, two sides of the integrated substrate module are used. In some variations, an element such as battery 732 may be provided separately from the integrated substrate module.

The components of the integrated substrate module 710 may be assembled in a separate manufacturing process. Under one embodiment, the integrated substrate module 710 may be manufactured and sold separately. The components that comprise the integrated substrate module 710 may be of a design specification. Likewise, dimensions (e.g. length or thickness) of the module may depend on manufacturing specifications, such as the desired form factor as provided by the housing of the device.

With reference to an embodiment of FIG. 6A thru FIG. 6G, the integrated substrate module 710 may be assembled as part of the computing device that includes the primary housing segment 610 by inserting the substrate module in the opening 626 of the back face 614. Some screws or other fasteners may be used to secure the substrate module to the housing.

In an embodiment, the integrated substrate module is created to be independently and fully functional prior to being assembled into a computing device. For example, the integrated substrate module may be operated as part of a testing or design stage for the mobile computing device. If the integrated substrate module fails such tests or requirements of design, resources required to install and assembly a whole computing device are avoided. Rather, the electronic portion of the device may be designed and tested separately from the housing or design processes for forming the housing.

Assembly

FIG. 8 is an exploded isometric view of a mobile computing device incorporating features of one or more embodiments described herein. A mobile computing device 800 includes a panel 810, a housing structure in form of a primary housing segment 820, integrated substrate module 830, and back panel 840. In one embodiment, the integrated substrate module 830 includes a printed circuit board 832 with modularized display component 834 and electrical contact layer 836 for a keypad assembly. Numerous other internal components of device 800 may be included on integrated substrate module 830, including processing resources (not shown), memory resources (not shown), power (e.g. from on-board battery or external connection), and wireless communication components. The wireless communication components may include both short range and long range components, including Bluetooth, cellular communications, Wireless Fidelity (or "WiFi"; i.e. 802.11(b) or 802.11(g)) communication components or Global Positioning System (GPS) devices.

As described with other embodiments, an embodiment of FIG. 8 reduces the number of housing elements used to create a mobile computing device (e.g. cellular phone) housing as compared to conventional designs. For example, some conventional techniques use a midframe that joins a front panel and a back panel. Often, devices include a fourth component to provide a backing for the battery panel. In contrast, an embodiment of FIG. 8 uses one shaped housing to eliminate need for the front panel, back panel or midframe of conventional designs. The back panel 840 may act as a battery panel.

According to one embodiment, the integrated substrate module 830 is modularized, so as to be pre-assembled and usable as one piece when assembling the device 800 as a whole. The integrated substrate module 830 may be inserted into the primary housing segment 820. The primary housing segment 820 may include front and structural features 822, 824 that serve to retain the integrated substrate module 830 in place. Fasteners, adhesives or other suitable components may also be used to retain the integrated substrate module 830 in position.

The panel 810 may be placed over the integrated substrate module 830 and within the housing structure 820. Unlike some other embodiments described, panel 810 is shaped to be non-rectangular, for purpose of design or style. Front structural features 822 may retain the panel 810 in position against the integrated substrate module 830. A display region 812 of the panel 810 may overlap with the display component 834 provided on the integrated substrate module 830. At least this portion of display region 812 may be clear or translucent so as to not occlude display component 834.

In one embodiment, a key structure layer 814 is molded, or otherwise formed or provided on a backing portion 816 of the panel 810. The key structure layer 814 overlaps with the electrical contact layer 836 on the integrated board 830. In one embodiment, the key structure layer 814 may include deformable key elements that enable a user to apply discrete pressure to panel 810, which translates into contact and actuation of individual contact elements on the electrical contact layer 836.

As shown by an embodiment of FIG. 8, the display region 812 may be substantially flush with surrounding non-display regions of the panel 810. This enables the panel 810 to provide a relatively smooth and flat front face for the device 800, without need for sunken or beveled display regions. Moreover, as described elsewhere, the key structure layer 814 may be formed on a corresponding region of the panel 810.

According to an embodiment, in order to assemble the device 800, one or more embodiments provide for the following steps to be performed: (i) insertion of the integrated substrate module 830 into the primary housing segment 820, with the direction of insertion being a top edge 831 of the board being moved into a bottom open region 821 of the housing structure; (ii) placement of the panel 810 over the integrated substrate module 830; and (iii) securement (via compression) of the back panel 840 against the primary housing segment 820. Additional features, such as a navigation ring may be provided at any time. Housing screws or other fasteners may be used to retain the primary housing segment 820 with the integrated substrate module.

Alternatives

While embodiments of FIG. 6A thru FIG. 6G provide for a single piece primary housing segment, other embodiments include multi-pieced housing segments. In one embodiment, the primary housing segment 610 (FIG. 6A) may be formed from two pieces. For example, the primary housing segment 610 may be formed from a top shell and a bottom shell that combine together to provide features such as shown and described with the primary housing segment. With reference to an embodiment of FIG. 8, the shells may be assembled to form openings on the front face and back face. In an embodiment, the integrated substrate module may be inserted through the opening in a manner described with one or more other embodiments.

As another addition or alternative, a front face of a housing segment such as described with any of the embodiments provided herein may include support frame structures to retain buttons or other mechanical actuators. For example, the front face may include a navigation input mechanism that includes one or more buttons. Structure from the primary (or from the two piece) housing segment may be used to retain the buttons that comprise such input feature. Similar housing structures may be used for application buttons and a keypad or keyboard.

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. This, the absence of describing combinations should not preclude the inventor from claiming rights to such combinations.

The invention claimed is:

1. A primary housing segment for a mobile computing device, wherein the primary housing segment is unitarily formed and shaped to provide (i) at least a majority of a plurality of perimeter surfaces, the perimeter surfaces including a pair of opposing lateral surfaces, a bottom surface, and a top surface; (ii) one or more frontal surface regions; and (iii) a rear surface to retain an integrated substrate module.

2. The primary housing segment of claim 1, wherein the primary housing segment defines a substantially open front face.

3. The primary housing segment of claim 1, wherein the primary housing segment is shaped to provide a substantially open front face and a partially open rear face.

4. The primary housing segment of claim 3, wherein the primary housing segment defines the partially open rear face by including an opening on a rear panel section of the primary housing segment, and wherein the rear panel section is structured to receive and mate with a panel that closes the opening.

5. The primary housing segment of claim 1,
wherein the primary housing segment is shaped to provide a substantially open front face and a partially open rear face, wherein the one or more frontal surface regions include a perimeter surface that extends between an inner perimeter edge that defines the open front face and an exterior perimeter edge of the frontal housing segment.

6. The primary housing segment of claim 5, wherein the one or more frontal surface regions include one or more frontal formations that retain the integrated substrate module.

7. The primary housing segment of claim 6, wherein the one or more frontal formations include at least two sections that extend inward from the perimeter surface and which are polygonal in shape.

8. The primary housing segment of claim 1, wherein the primary housing segment is unitarily formed through a molding process.

9. A housing assembly for a mobile computing device, the housing assembly comprising:
a primary housing segment that is unitarily formed and shaped to provide (i) at least a majority of a plurality of perimeter surfaces, the perimeter surfaces including a pair of opposing lateral surfaces, a bottom surface, and a top surface; (ii) one or more frontal surface regions; and (iii) a rear structural surface to retain the integrated substrate module;
wherein the primary housing segment provides a substantially open front face and a partially open rear face; and
wherein the primary housing segment defines the partially open rear face by including an opening on a rear section of the housing segment, and wherein the rear section is structured to receive and mate with a panel that closes the opening.

10. The housing assembly of claim 9,
wherein the primary housing segment is shaped to provide a substantially open front face and a partially open rear face,
wherein the one or more frontal surface regions include a perimeter surface that extends between an inner perimeter edge that defines the open front face and an exterior perimeter edge of the frontal housing segment.

11. The primary housing segment of claim 10, wherein the one or more frontal surface regions include one or more inwardly extending polygonal frontal formations.

12. The housing assembly of claim 10, further comprising a panel that is shaped to fit between the one or more frontal surface regions and the integrated substrate module.

13. A mobile computing device comprising:
a housing comprising a primary housing segment that is unitarily formed and shaped to provide (i) at least a majority of a plurality of perimeter surfaces, the perimeter surfaces including a pair of opposing lateral surfaces, a bottom surface, and a top surface; (ii) a frontal structural surface to retain an integrated substrate module or component; and (iii) a rear structural surface to retain the integrated substrate module;
an integrated substrate module that is retained within the housing, wherein the substrate module includes a set of electrical components, including a processor and a display assembly;
wherein the mobile computing device is formed by an assembly process that includes inserting the substrate module as a single component within a confinement defined by the housing.

14. The mobile computing device of claim 13, wherein the primary housing segment provides an opening on at least one of the frontal structural surface or the rear structural surface, and wherein the assembly process includes inserting the substrate module in the opening.

15. The mobile computing device of claim 14, wherein the primary housing segment provides an opening on the rear structural surface, and wherein the assembly process includes inserting the substrate module in the opening of the rear structure surface, and wherein the housing further comprises a rear panel section that mates over opening.

16. The mobile computing device of claim 13,
wherein the primary housing segment provides a substantially open front face and a partially open rear face; and
wherein the primary housing segment defines the partially open rear face by including an opening on a rear section of the housing segment, and wherein the rear section is structured to receive and mate with a panel that closes the opening.

17. The mobile computing device of claim 13, wherein the set of electrical components on the substrate module include all of the processing and memory resources of the mobile computing device.

18. The mobile computing device of claim 13, wherein the housing segment is unitarily formed through a molding process.

19. A hardware module for a computing device, the module comprising:
a substrate;
a plurality of electrical components assembled onto the substrate, the plurality of electrical components including substantially all of the electrical components that are to be used by a computing device that is to include the module;
wherein the module is integrated to form a single piece for a subsequent process of assembling the computing device by inserting the module in a housing of the computing device.

20. The module of claim 19, wherein the plurality of electrical components include one or more chips that correspond to all of the processors and memory components that are used by the computing device.

21. The module of claim 19, wherein the plurality of components include at least one of each of a processor, a memory component, a display component, and a battery.

22. The module of claim 19, wherein the module is configured to be fully and independently operational prior to being assembled into the computing device.

23. A computing device comprising:
a primary housing segment, wherein the primary housing segment is unitarily formed and shaped to provide (i) at least a majority of a plurality of perimeter surfaces, the perimeter surfaces including a pair of opposing lateral surfaces, a bottom surface, and a top surface; (ii) one or more frontal surface regions; and (iii) a rear surface to retain an integrated substrate module;
an integrated substrate module comprising:
a substrate;
a plurality of electrical components assembled onto the substrate, the plurality of electrical components including substantially all of the electrical components that are to be used by the computing device;
wherein the module is integrated to form a single piece, so that the computing device is assembled in part by inserting the integrated substrate module as a single piece into a space within the confines of the primary housing segment.

* * * * *